(12) United States Patent
Levesque et al.

(10) Patent No.: US 7,225,586 B2
(45) Date of Patent: Jun. 5, 2007

(54) MOUNTING METHOD FOR RACK-MOUNTED DOOR

(75) Inventors: Stewart A. Levesque, Scotland, CT (US); Lars R. Larsen, Old Lyme, CT (US)

(73) Assignee: Ortronics, Inc., New London, CT (US)

(*) Notice: Subject to any disclaimer, the term of this patent is extended or adjusted under 35 U.S.C. 154(b) by 9 days.

(21) Appl. No.: 11/240,054

(22) Filed: Sep. 30, 2005

(65) Prior Publication Data

US 2006/0086054 A1 Apr. 27, 2006

Related U.S. Application Data

(62) Division of application No. 10/724,788, filed on Dec. 1, 2003, now Pat. No. 6,968,647.

(51) Int. Cl.
*E05D 15/50* (2006.01)
(52) U.S. Cl. .......................... 49/506; 49/192
(58) Field of Classification Search ............. 49/381, 49/192, 193, 382, 506; 16/268; 211/26; 312/265.1, 324, 326, 329, 223.1; 52/71
See application file for complete search history.

(56) References Cited

U.S. PATENT DOCUMENTS

| | | | |
|---|---|---|---|
| 331,466 | A | 12/1885 | Whitney |
| 1,550,205 | A | 8/1925 | Cemazar |
| 1,560,537 | A | 11/1925 | Cole |
| 2,195,679 | A | 4/1940 | Rapp |
| 2,195,991 | A | 4/1940 | Lovett |
| 2,817,870 | A * | 12/1957 | Howell .................. 16/231 |
| 3,048,898 | A | 8/1962 | Davis |
| 3,403,473 | A | 10/1968 | Navarro |
| 3,976,024 | A | 8/1976 | Fillery |
| 4,103,956 | A | 8/1978 | Faulstich |
| 4,612,728 | A | 9/1986 | Moriyoshi |
| 4,811,518 | A | 3/1989 | Ladisa |
| 5,357,652 | A | 10/1994 | Yamada |
| 5,367,828 | A | 11/1994 | Hashemnia |
| 5,407,263 | A | 4/1995 | Jones et al. |
| 5,548,927 | A * | 8/1996 | Song .......................... 49/193 |
| 5,560,148 | A | 10/1996 | Chang |

(Continued)

FOREIGN PATENT DOCUMENTS

DE 0504044 9/1992

(Continued)

*Primary Examiner*—Gregory J. Strimbu
(74) *Attorney, Agent, or Firm*—McCarter & English, LLP

(57) ABSTRACT

A methods for mounting, opening, closing and releasing a door assembly relative to a mounting structure employ a first structure that defines at least one elongated guide channel and a latching subassembly that is adapted to be mounted with respect to the foregoing guide channel and to rotate with respect thereto. Rotation of the latching subassembly with respect to the guide channel allows a latching region, e.g., a V-shaped latching region, to move between a first position (wherein the latching region is adapted to receive the mounting structure) and a second position (wherein the latching region cannot receive the mounting structure). In the second position, the latching region (in combination with the guide channel) is structured to capture the mounting structure (e.g., a projection associated with a cable management system) therewithin.

17 Claims, 6 Drawing Sheets

U.S. PATENT DOCUMENTS

| | | | |
|---|---|---|---|
| 5,647,652 A * | 7/1997 | Zalewski et al. | 312/324 |
| 5,675,934 A * | 10/1997 | Park | 49/193 |
| 5,697,121 A * | 12/1997 | Early | 16/231 |
| 5,761,849 A | 6/1998 | Tokuno | |
| 5,926,916 A | 7/1999 | Lee et al. | |
| 6,000,771 A * | 12/1999 | Wissinger et al. | 312/405 |
| 6,003,716 A * | 12/1999 | Allison et al. | 220/326 |
| 6,065,612 A * | 5/2000 | Rinderer | 211/26 |
| 6,250,729 B1 * | 6/2001 | Allison et al. | 312/324 |
| 6,489,565 B1 * | 12/2002 | Krietzman et al. | 174/101 |
| 6,708,368 B2 * | 3/2004 | Nhep et al. | 16/232 |
| 6,814,244 B1 * | 11/2004 | Hathcock | 211/26 |
| 6,835,891 B1 * | 12/2004 | Herzog et al. | 174/66 |
| 6,946,605 B2 * | 9/2005 | Levesque et al. | 174/100 |
| 7,026,553 B2 * | 4/2006 | Levesque et al. | 174/100 |
| 2003/0020379 A1 | 1/2003 | Larsen et al. | |

FOREIGN PATENT DOCUMENTS

| | | |
|---|---|---|
| JP | 3-161680 | 11/1991 |
| JP | 6-58039 | 1/1994 |

* cited by examiner

MOUNTING METHOD FOR RACK-MOUNTED DOOR

CROSS-REFERENCE TO RELATED APPLICATIONS

The present application is a divisional application claiming the benefit of a and commonly assigned application entitled "Rack Mounted Door Assembly," which was filed on Dec. 1, 2003 and assigned Ser. No. 10/724,788 now U.S. Pat. No. 6,968,647.

BACKGROUND OF THE DISCLOSURE

1. Technical Field

The present disclosure relates to an advantageous door design and, more particularly, to a door design having particular utility for rack-related mounting, e.g., in connection with a cable raceway or other electronic equipment application(s). The advantageous door design of the present disclosure is structured so as to be simultaneously hinged at the left and at the right, and to permit easy opening from either the right or left, as well as complete removal of the door from its mounting structure.

2. Background of the Disclosure

Typical electronic cabinets include a frame structure that defines a plurality of shelves upon which electronic items may be positioned and/or stored. Electronic cabinets typically include openings at various locations, e.g., top and side locations, to facilitate wiring, heat dissipation, and/or ready access to power source(s). Generally, electronic cabinets include a door that permits the contents of the cabinet to be shielded from view and/or protected from damage. The door is typically mounted to the frame by a hinge that is located on one side of the door, and a latch is typically provided on the other side of the door so that the door may be opened, for example, from left to right. Many existing electronic cabinet designs allow the user to unfasten the hinge assembly from the cabinet to allow the door to be flipped over, remounted and subsequently opened in the opposite direction, for example, from right to left.

The patent literature discloses prior efforts directed to developing modified systems for mounting movable elements, e.g., windows and doors, relative to fixed frames. Thus, for example, U.S. Pat. No. 5,560,148 to Chang discloses a dual axle linkage mechanism for doors and casement windows. The dual axle linkage mechanism disclosed in the Chang '148 patent includes a rotary unit that utilizes a spindle, an upper guiding block, a lower guiding block, a holding device, a retaining device and a restoring spring. According to the Chang disclosure, the driving device is able to move a pair of spindles on one side up or down in the frame, thereby permitting either side a door or window to serve as a rotary axle, provided it has a spindle disposed therein.

Additional teachings in the patent literature include U.S. Pat. No. 4,811,518 to Ladisa, wherein a double-action door structure is provided that may be opened along either side edge and in either direction by pushing or pulling. The disclosed Ladisa '518 door structure includes spring-loaded balls that are movable upwardly and downwardly into engagement on the sides of the door by a push bar/cam mechanism. U.S. Pat. No. 3,403,473 to Navarro provides a mechanism for reversibly mounting a door on a cabinet frame so that the door may be opened from either side. The Navarro '473 mechanism includes a pivot pins on both sides of the door that are movable into and out of engagement with supports using toggle arrangements. U.S. Pat. No. 3,048,898 to Davis discloses a combination latch and hinge mechanism that permits a door to be opened relative to the left or right hand edge. Additional systems for mounting movable elements, e.g., windows and doors, relative to fixed frames are disclosed in U.S. Pat. No. 331,466 to Whitney; U.S. Pat. No. 1,560,537 to Cole; U.S. Pat. No. 1,550,205 to Cemazar; U.S. Pat. No. 2,195,991 to Lovett; U.S. Pat. No. 4,612,728 to Moriyoshi; U.S. Pat. No. 5,357,652 to Yamada; U.S. Pat. No. 5,367,828 to Hashemnia; U.S. Pat. No. 5,926,916 to Lee et al.; and commonly assigned U.S. Patent Publication No. 2003/0020379 to Larsen et al.

Despite efforts to date, a need remains for a door design with enhanced usability. More particularly, a need remains for a door that enables a user to easily and efficiently open from left to right and from right to left, or to completely remove the door from its mounting structure. Although such need extends across a wide variety of applications, particular interest for an enhanced door design in applications involving storage of, and access to, electronic equipment and associated cabling/wiring.

SUMMARY OF THE DISCLOSURE

The present disclosure provides a door design that enables a user to easily and efficiently open such door from left to right and from right to left, or to completely remove the door from its mounting structure. The structural mechanism(s) associated with the present disclosure enable a user to open the advantageous door in either direction through interaction with a rotatable handle mechanism that may extend over a substantial portion of the length of the disclosed door member. The disclosed mechanism(s) provide the added benefit of making the door easily removable by opening or releasing mechanisms positioned on both sides of the door. The ease of door removability is particularly advantageous for electronic cabinetry or other cabling/wiring applications, e.g., during the installation of an electronic/computer network, when access to cabinet interior and/or cable raceways is most pronounced, and also when a large number of adds, moves and changes and/or equipment swaps are to be performed.

In an exemplary embodiment of the present disclosure, a door assembly is provided that includes: (i) a door component that defines first and second guide channels, (ii) a first end cap that is mountable with respect to a first end of the door component and that defines at least two slots in a back face thereof, (iii) a second end cap that is mountable with respect to a second end of the door component and that defines at least two slots in a back face thereof; and (iv) a pair of latching subassemblies that are rotatably mounted with respect to the first and second guide channels, respectively, each of the pair of latching subassemblies including an elongated latch member, a pair of latch elements mounted with respect to the elongated latch member, and an accessible handle portion. Each of the disclosed pair of latch elements generally defines a slot that may be rotated between (i) a first position wherein a mounting structure may be received by the slot and (ii) a second position wherein a mounting structure may be captured by the slot and the first or second guide channel.

The present disclosure also advantageously provides a cable management system that, in an exemplary embodiment thereof, includes and wire cage assembly and a door assembly. The wire cage assembly generally includes: (i) an upper wire element that defines left and right downward projections, and (ii) a lower wire element that defines left and right upward projections. The disclosed door assembly typically includes: (i) a door component that defines first and second guide channels; (ii) a first end cap that is mountable with respect to a first end of the door component and that defines at least two slots in a back face thereof; (iii) a second end cap that is mountable with respect to a second end of the door component and that defines at least two slots in a back face thereof; and (iv) a pair of latching subassemblies that are rotatably mounted with respect to the first and second guide channels, respectively, each of the pair of latching subassemblies including an elongated latch member, a pair of latch elements mounted with respect to said elongated latch member, and an accessible handle portion. Each of the latch elements advantageously defines slots that may be rotated between (i) a first position wherein at least one of the upward and downward projections may be received by the slot, and (ii) a second position wherein the upward and downward projection(s) may be captured by the slot and the first or second guide channel.

A method for mounting a door assembly relative to a mounting structure is also provided according to the present disclosure. In an exemplary embodiment of the present disclosure, the method includes providing a mounting structure that includes at least two pairs of mounting extensions. The disclosed method further includes providing a door assembly that includes (i) a door component that defines first and second guide channels; (ii) a first end cap that is mountable with respect to a first end of the door component and that defines at least two slots in a back face thereof; (iii) a second end cap that is mountable with respect to a second end of the door component and that defines at least two slots in a back face thereof; and (iv) a pair of latching subassemblies that are rotatably mounted with respect to the first and second guide channels, respectively, each of the pair of latching subassemblies including an elongated latch member, a pair of latch elements mounted with respect to the elongated latch member, and an accessible handle portion. The latch elements generally define slots that may be rotated between (i) a first position wherein at least one of the upward and downward projections may be received by the slot, and (ii) a second position wherein the upward and downward projection(s) may be captured by the slot and the first or second guide channel. The disclosed method further general involves mounting the door assembly to the mounting structure by capturing the pairs of mounting extensions within the slots defined by the latch elements.

Additional advantageous features and functions of the disclosed door assembly and uses thereof will be apparent from the detailed description which follows, particularly when reviewed in conjunction with the figures appended hereto.

BRIEF DESCRIPTION OF THE DRAWINGS

So that those of ordinary skill in the art to which the subject disclosure pertains will more readily understand how to make and use the disclosed door design, exemplary embodiments are described with reference to the accompanying drawings, wherein.

DETAILED DESCRIPTION OF EXEMPLARY EMBODIMENT(S)

According to the present disclosure, an advantageous door system is disclosed that permits a user to easily and efficiently open a mounted door from left to right and from right to left, or to completely remove the door from its mounting structure. The structural mechanism(s) associated with the present disclosure enable a user to open the advantageous door in either direction through interaction with rotatable handle mechanism(s) that may extend over a substantial portion of the length of the disclosed door member. The disclosed mechanism(s) provide the added benefit of making the door easily removable by opening or releasing mechanisms positioned on both sides of the door. The ease of door removability is particularly advantageous for electronic cabinetry or other cabling/wiring applications, e.g., during the installation of an electronic/computer network, when access to cabinet interior and/or cable raceways is most pronounced, and also when a large number of adds, moves and changes and/or equipment swaps are to be performed.

With reference to the figures appended hereto, exemplary embodiment(s) of the door system according to the present disclosure, including advantageous mechanisms for mounting, locking and releasing the door for movement with respect to a stationary mounting structure, are depicted. With initial reference to FIG. 1, a perspective view of a door 100 that includes a top end cap 102, a bottom end cap 104, and an intermediate door component 106. Of note, exemplary door 100 is symmetric in design, such that the overall assembly may be inverted without loss of functionality, as described herein. Thus, the reference to a top end cap and a bottom end cap is merely for descriptive purposes, based on the views presented in the accompanying figures, and does not signify any structural and/or functional distinction therebetween.

Figure 1:
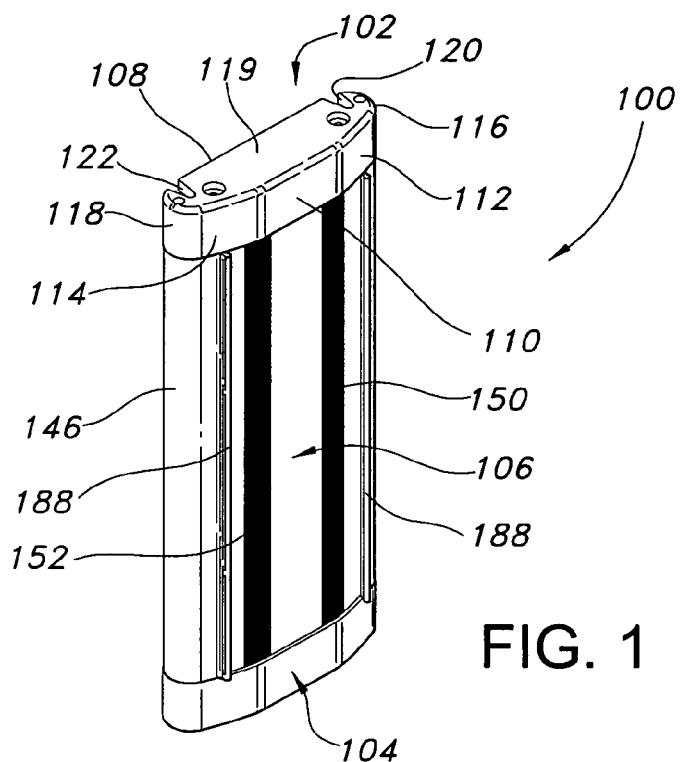
FIG. 1 is a perspective plan view of an exemplary door in accordance with an embodiment of the present disclosure.

In the exemplary embodiment of FIG. 1, door 100 features an aesthetically desirable geometry and surface treatment. Thus, with reference to FIGS. 1 and 4, top and bottom end caps 102, 104 generally include a back face 108, and a front wall 109 that includes a front face 110 that is substantially parallel to back face 108, forwardly-directed angled faces 112, 114 and arcuate faces 116, 118. Top and bottom end caps 102, 104 also include an outward face 119 that defines an outer surface of assembled door 100. A pair of V-shaped slots 120, 122 are formed in top and bottom end caps 102, 104 in the region between back face 108 and the respective arcuate faces 116, 118. V-shaped slots are generally diverge at an angle of about 15° to about 25° and, in an exemplary embodiment, diverge at an angle of about 20°. Circular protuberances 124, 126 extend from outward face 119 adjacent to the respective V-shaped slots 120, 122. The functions of V-shaped slots 120, 122 and protuberances 124, 126 are discussed in greater detail below.

Figure 3:
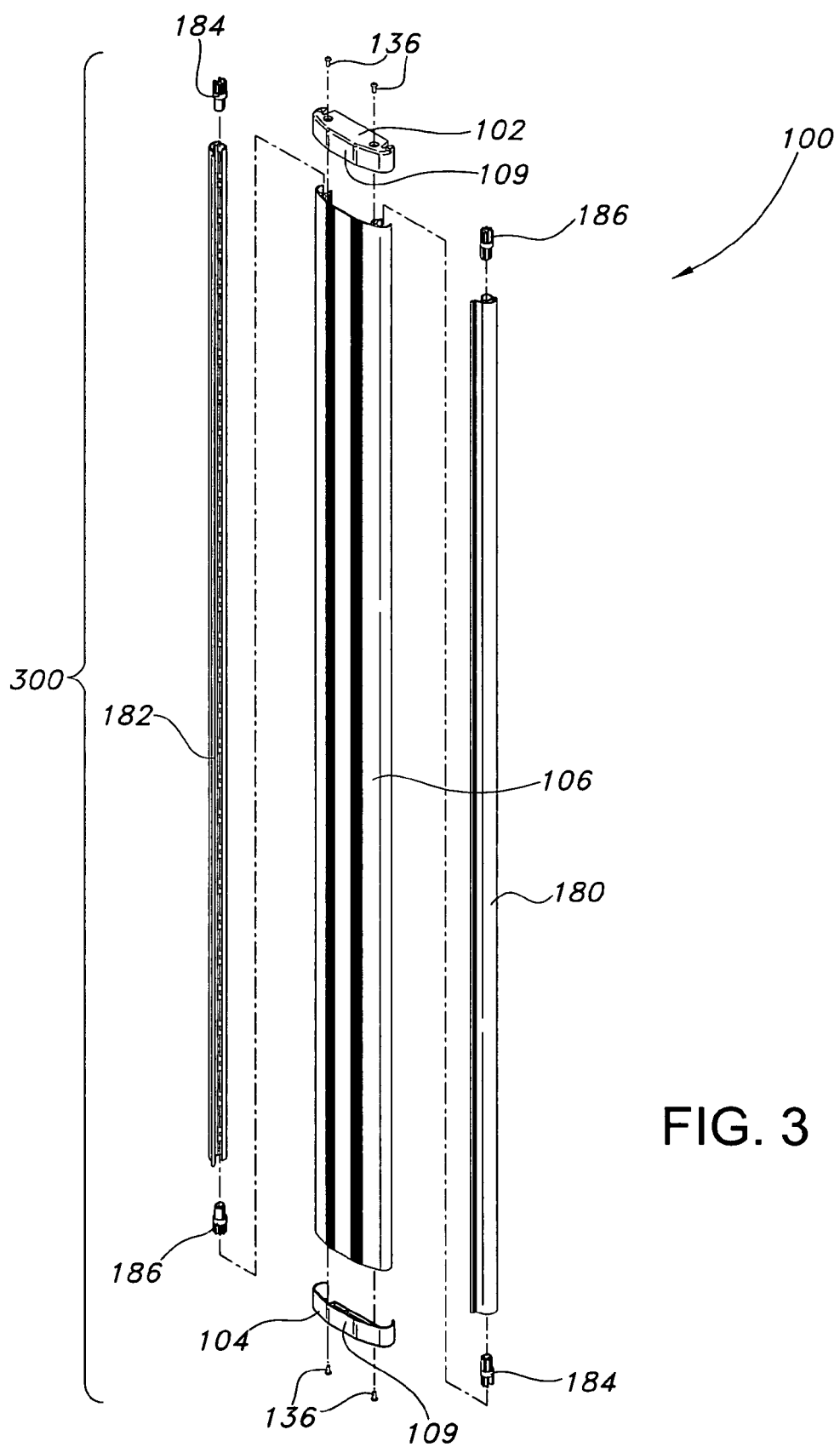
FIG. 3 is an exploded view of the exemplary door of FIG. 1.
Figure 4:
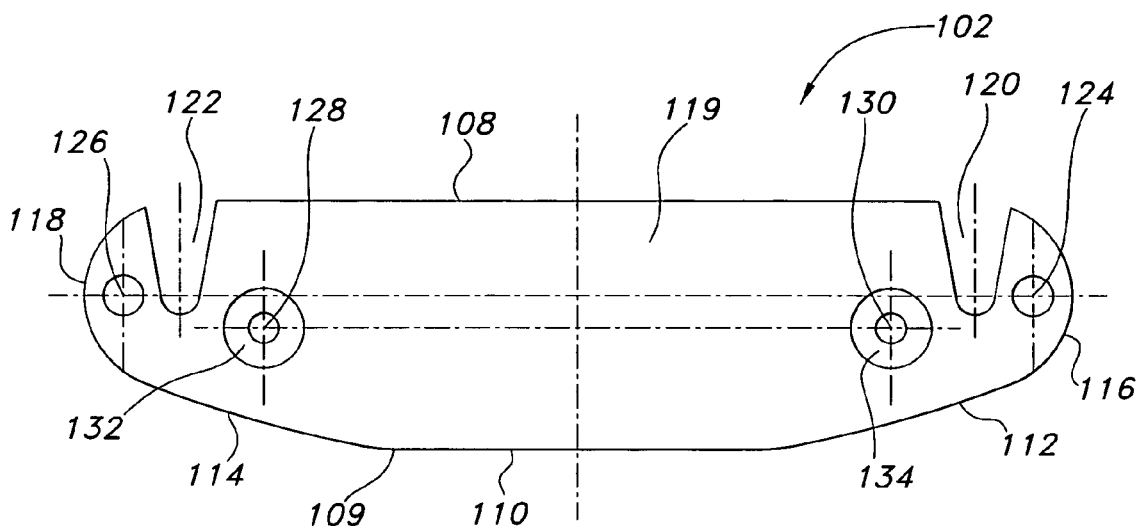
FIG. 4 is a top view of an exemplary end cap according to a door embodiment of the present disclosure.

With further reference to FIG. 4, a pair of apertures 128, 130 are formed in outward face 119 for use in mounting end caps 102, 104 with respect to door component 106. Apertures 128, 130 are advantageously positioned in counter-sink regions 132, 134 so as to seat the attachment elements, e.g., screws 136 (see FIG. 3) and washers (not pictured), below the surface of outward face 119. End caps 102, 104 may be advantageously molded from conventional polymeric materials, e.g., a polycarbonate (Lexan® polycarbonate, GE Plastics), acrylonitrile butadiene styrene (ABS), an ABS/polycarbonate material (Cycoloy™ material, GE Plastics), a glass-filled polycarbonate (e.g., 10% glass filled polycarbonate), and the like. Of note, the front wall 109 of end caps 102, 104, which is defined by arcuate faces 116, 118, angled faces 112, 114 and front face 110, has a greater height (e.g., about 1.25 to 1.75") as compared to the reduced height of back face 108 (e.g., about 0.25 to 0.5"). The transition in height from front wall 109 (e.g., 1.5") to the back face 108 (e.g., 0.3") occurs at the outer edges of V-shaped slots 120, 122. Thus, when viewed from the left or right side, the extended height of front wall 109 is apparent, whereas when viewed from the rear (not shown), the V-shaped slots 120, 122 connect to back face 108 which is of reduced height. The reduced height in the region of V-shaped slots 120, 122 and back face 108 facilitates mounting of end caps 102, 104 to door component 106, and further facilitates the latching functionalities, as described below.

Figure 5:
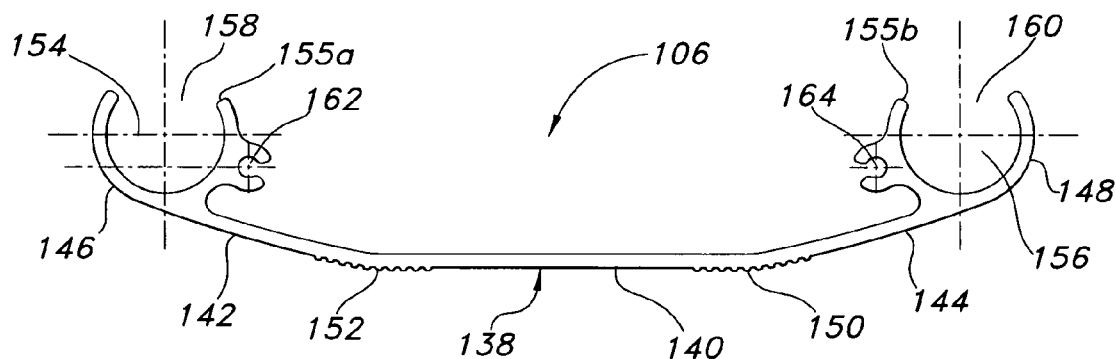
FIG. 5 is a top view of an exemplary door component according to an embodiment of the present disclosure.

With reference to FIGS. 1 and 5, door component 106 includes a front wall 138 that is defined by a front face 140, angled faces 142, 144 and arcuate faces 146, 148. The overall geometry of front wall 138 generally corresponds to the geometry of front wall 109 of end caps 102, 104. However, the dimensions of end caps 102, 104 are generally slightly greater so that end caps 102, 104 may be fit onto door component 106 (i.e., top and bottom portions of door component 106 are advantageously nested within top and bottom end caps 102, 104, respectively. Aesthetic features 150, 152 may be advantageously molded into or onto front wall 138 to enhance the visual appearance of door 100. Aesthetic features 150, 152 may take a variety of forms, e.g., vertically aligned ridges, and may be supplemented with additional aesthetic features/regions, e.g., additional vertically aligned ridges spaced from aesthetic features 150, 152. The noted aesthetic features do not contribute to the functional aspects of the disclosed door 100.

With further reference to FIG. 5, wall component 106 is symmetric in design and defines first and second guide channels 154, 156 that extend the height of door component 106. Guide channels 154, 156 define elongated openings 158, 160 for receipt of and interaction with elongated latching members 180, 182 (see FIGS. 3 and 9). Guide channels 154, 156 are substantially circular in cross-section and the wall defining each of guide channels 154, 156 typically defines an arc of approximately 240° to about 270° and, in an exemplary embodiment, defines an arc of about 260°. Thus, in an exemplary embodiment of the disclosed door 100, openings 158, 160 typically define an arc of about 90° to about 120° (preferably, about 110°). Ancillary arcuate regions 162, 164 are defined on an inner edge of guide channels 154, 156, respectively, and define a bounded region, e.g., a region bounded by an arc of about 300°. Arcuate regions 162, 164 typically extend for the height of door component 106 and are aligned with apertures 128, 130 formed in end caps 102, 104. Thus, screws 136 may be mounted into opposite ends of arcuate regions 162, 164, i.e., when wall component 106 is nested within end caps 102, 104.

With reference to FIGS. 3, 6A, 6B and 7–9, the advantageous latching functionalities associated with exemplary door members of the present disclosure are now provided. Each of elongated latching members 180, 182 advantageously interact with first and second latch elements 184, 186. Elongated latching members 180, 182 are identical structures and are used in respective guide channels 154, 156 in opposite orientations, as will be apparent from the description which follows. Latch elements 184, 186 are generally of reduced height and are configured and dimensioned to be positioned in the open ends of latch members 180, 182. Latch elements 184, 186 are generally mirror images of each other, as will be described in greater detail below.

Figure 9:
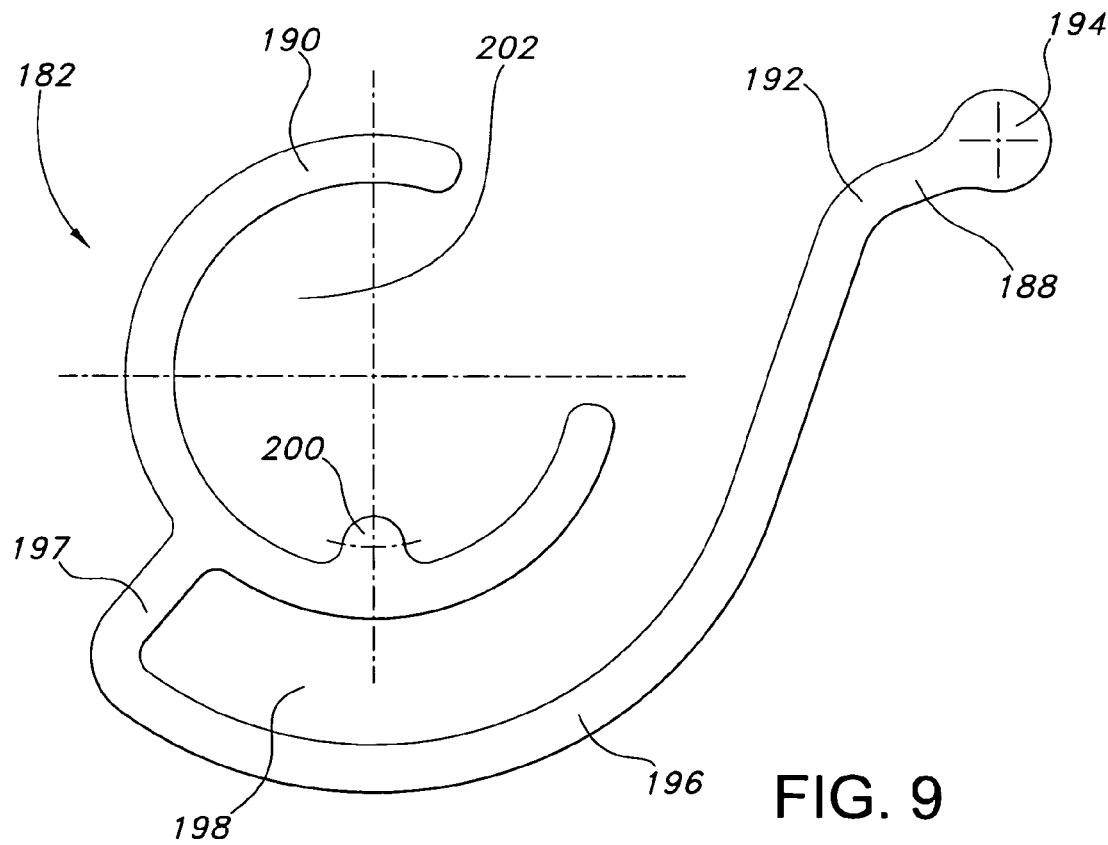
FIG. 9 is a top view of a further latching element according to an exemplary embodiment of the present disclosure.

With particular reference to the cross-sectional view of FIG. 9, elongated latching member 182 includes an outwardly extending handle portion 188 that extends away from inner channel wall 190 due to inflection 192. Handle portion 188 advantageously includes an edge region 194 of increased diameter, e.g., a region of circular cross-section, to enhance the ease and safety of use. Handle portion 188 further includes an arcuate arm 196 that is joined to inner channel wall 190 by extension 197. A bounded arcuate space 198 is defined by arcuate arm 196, extension 197 and inner channel wall 190. Key 200 extends into the channel region 202 defined within channel wall 190 opposite the bounded space 198. The radius of curvature of arcuate arm 196 of handle portion 188 advantageously substantially conforms to the radius of curvature of arcuate faces 146, 148 of wall component 106, such that arcuate faces 146, 148 are free to travel within bounded space 198, as discussed below.

With reference to FIG. 3, latch elements 184, 186 are mounted such that they are partially within channel regions 202 of respective elongated latch members 180, 182. Structural details of exemplary latch elements 184, 186 are now described with reference to FIGS. 6A, 6B, 7 and 8. Latch elements 184, 186 include a mounting extension 210, an intermediate band 212 and a latching region 214. Each of these structural regions is discussed in turn.

Figures 6A, 6B:
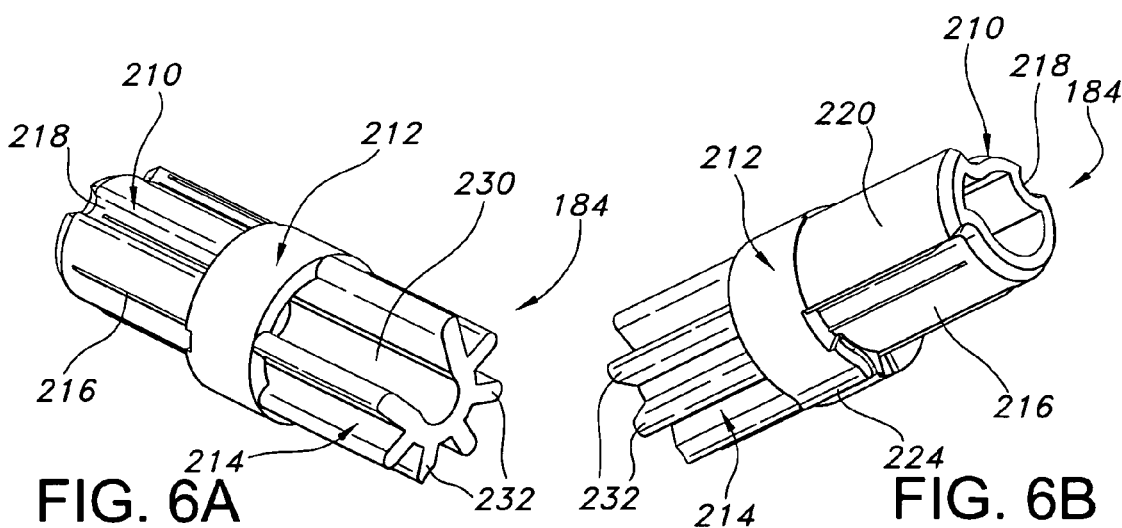
FIG. 6A is a perspective plan view of a latching element according to an exemplary embodiment of the present disclosure.
FIG. 6B is a further perspective view of the latching element of FIG. 6A.

With particular reference to FIGS. 6A and 6B, mounting extension 210 of latch element 184 includes a substantially cylindrical plug 216 that includes an inwardly directed key slot 218 formed therein. Key slot 218 is configured and dimensioned to cooperate with key 200 that extends into channel region 202 of elongated latch members 180, 182. Mounting extension 210 further includes an arcuate shell 220 of greater diameter than the remainder of substantially cylindrical plug 216. Arcuate shell 220 is configured and dimensioned to substantially fill the arcuate opening defined by inner channel wall 190, thereby completing the arc of channel wall 190 to define substantially a complete circle. Of note, the combination of key 200/key slot 218 and channel wall 190/arcuate shell 220 ensures that latch element 184 is properly and securely positioned with respect to the elongated latch members 180, 182. Of further note, if the key/key slot and channel wall/arcuate shell do not geometrically correspond, then the assembler should utilize latch element 186 (based on the fact that the key slot will be positioned in a mirror orientation relative to the arcuate shell).

Thus, mounting extension 210 is adapted to be aligned with the channel region 202 of a corresponding elongated channel member 180, 182. The mounting extension 210 is typically press fit into the channel region, with the key/key slot in alignment and with the arcuate shell in alignment with the opening in channel wall 190. When fully pressed into position, the intermediate band 212 of the latch element 184, 186 is in abutting contact with channel wall 190. Substantial stability is ensured through the structural interaction between the latch elements 184, 186 and the elongated latch members.

Figure 8:
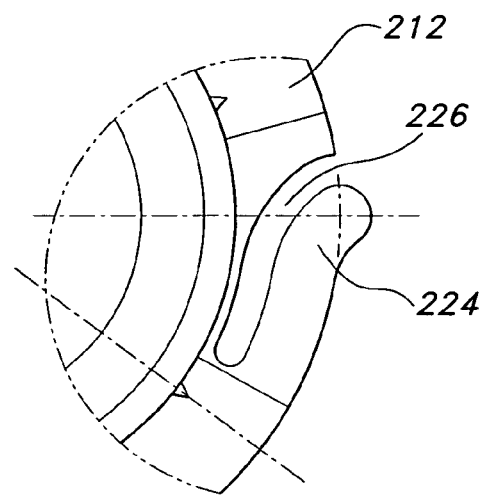
FIG. 8 is an end view of a segment of an exemplary latching structure according to the present disclosure.

With further reference to FIGS. 6A, 6B and 8, intermediate band 212 is substantially cylindrical in geometry and its diameter generally corresponds to the diameter of arcuate shell 220. However, as shown in FIG. 8, intermediate band 212 includes a deflection arm 224 that is biased outwardly, i.e., beyond the diameter of the remainder of intermediate band 212. Deflection arm 224 is formed by an undercut 226 and is advantageously positioned on the circumference of latch element 184, 186 such that, when the subassembly formed by an elongated latch member 180, 182 and two latch elements 184, 186 is introduced into a guide channel 154, 156 of door component 106, deflection arms 224 (one on each of latch elements 184, 186) deflectably engages the inner edge 155a, 155b of such guide channel 154, 156. Thus, deflection arm 224 functions as an interference "stop" for the latching functionality associated with the present disclosure, such interference "stop" being easily overcome based on the flexure properties of deflection arm 224, and advantageously provides a tactile sensation as a user undertakes the delatching of such latching subassembly associated with exemplary door 100, as described below.

Figure 7:
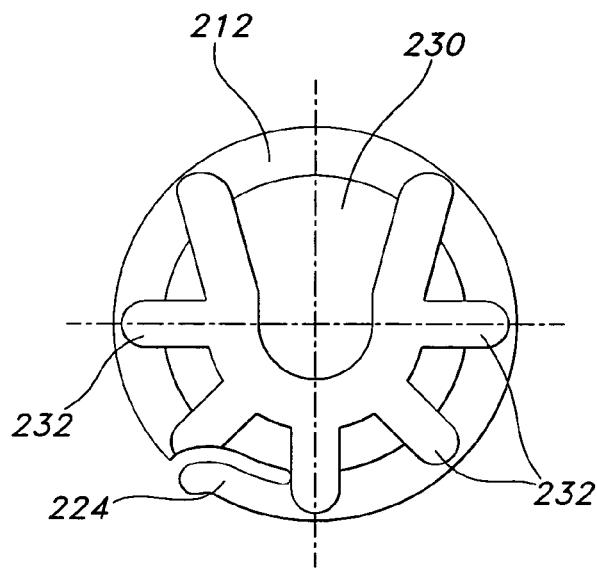
FIG. 7 is an end view of the latching structure of FIGS. 6A and 6B.

Turning to latching region 214 of latch elements 184, 186, reference is made to FIGS. 6A, 6B and 7. Latching region 214 includes a substantially V-shaped latching region 230 and a plurality of radial ribs 232 for spacing latching region 214 relative to guide channels 154, 156 of door component 106. Of note, in exemplary embodiments of the present application, V-shaped latching region 230 is aligned with key slot 218. Based on such relative positioning of the V-shaped latching region and key slot, when latch elements 184, 186 are mounted with respect to elongated latch members 180, 182, the V-shaped latching regions 230 are generally directed toward the arcuate bounded space 198 thereof.

As shown in the exploded view of FIG. 3, latch elements 184, 186 are advantageously partially inserted in elongated latching members 180, 182 to define a latching subassembly 300. As noted above, latch elements 184, 186 are mounted with respect to latching members 180, 182 by inserting mounting extension 210 into channel region 202 (with key/key slot alignment and arcuate shell/channel wall opening alignment). Thereafter, each latching subassembly 300 is introduced to a corresponding guide channel 154, 156 in door component 106. Introduction of the latching subassembly 300 with respect to the door component 106 requires that each bounded arcuate space 198 receives the corresponding arcuate face 146, 148 of door component. In assembly, latching subassembly 300 is advantageously slid relative to door component 106, with the bounded arcuate space 198 encasing the appropriate portion of arcuate face 146, 148, and with inner channel wall 190 (and the associated latch elements 184, 186) within guide channels 154, 156.

Although not critical as to sequence, it may be desired to mount a first end cap 102, 104 to door component 106 before introducing latch subassemblies 300. The end cap 102, 104 is typically mounted to the door component 106 by introducing screws 136 through apertures 128, 130 and into arcuate regions 162, 164. Latching assembly 300 is typically slid with respect to the guide channels 154, 156 until arcuate arm 196 is abutting relation to arcuate faces 116, 118 of end cap 102, 104. In such orientation, latch element 184, 186 is advantageously nested within guide channel 154, 156 and interior to end cap 102, 104. Moreover, the inner channel wall 190 of latching member 180, 182 fits within guide channels 154, 156 (with sufficient clearance to permit relative rotational motion therebetween).

After each of the latching assemblies 300 has been introduced to the corresponding guide channel 154, 156, the second end cap 102, 104 is mounted to door component 106, i.e., by introducing screws 136 through apertures 128, 130 and into arcuate regions 162, 164. Once both end caps 102, 104 are mounted to door component 106, exemplary door 100 as shown in FIG. 1 is constructed.

Figure 2:
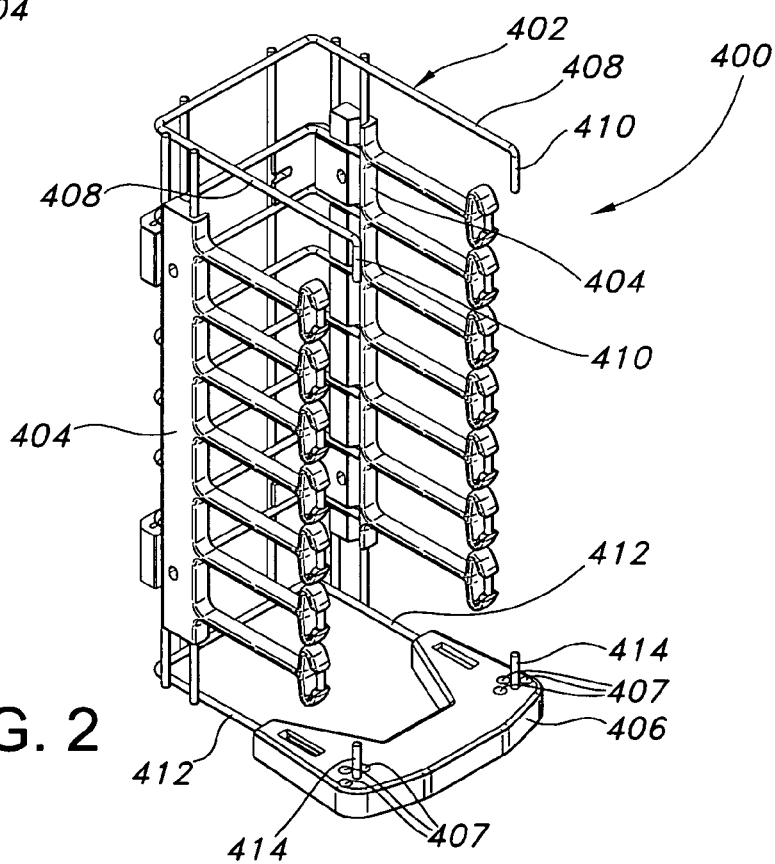
FIG. 2 is a perspective plan view of an exemplary wire cage/cable guide subassembly with which the presently disclosed door design may be advantageously employed.

The operation of exemplary door 100 for purposes of mounting, opening, closing, and removal is now described. With reference to FIG. 2, exemplary door 100 has particular utility for use in conjunction with cable management system 400, which includes a wire cage assembly 402 and a plurality of cable guides 404. Cable management system 400 further includes a base member 406 that is mounted with respect to wire cage assembly 402. Base member 406 advantageously includes a plurality of circular indents 407 that are positioned on the surface of base member 406 so as to align with protuberances 124, 126 of end caps 102, 104, according to the present disclosure. Additional details concerning the design, operation and advantageous functionalities of cable management system 400 is provided in a commonly assigned and contemporaneously filed patent application entitled "Cable Management System," Ser. No. 10/724,792, the entire subject matter of which is hereby incorporated by reference.

With further reference to FIG. 2, wire cage assembly 402 includes top wire segments 408 that include downward projections 410. Wire cage assembly 402 further includes bottom wire segments 412 that include upward projections 414 that extend through apertures formed in base member 406. Opposed downward projections 410 and upward projections 414 are substantially aligned and are advantageously spaced by a distance that permits them to cooperate with latch subassemblies 300 of the present disclosure.

In use, exemplary door 100 may be advantageously mounted and employed with respect to cable management system 400 and, more particularly, door 100 may be mounted and employed with respect to wire cage assembly 402. However, it is specifically noted that exemplary door 100 is not limited to use with a cable management system and/or wire cage assembly of the type disclosed in FIG. 2 hereto. Rather, exemplary door assembly 100 may be advantageously mounted and employed in connection with any mounting system that includes mounting structures that are structurally and/or functionally equivalent to projections 410, 414, i.e., mounting structures that can interact with the disclosed latching subassemblies of the present disclosure. For illustrative purposes, however, the mounting and use of exemplary door 100 in combination with cable management system 400 is described herein.

Exemplary door 100 is mounted with respect to cable management system 400 by aligning projections 410, 414 with V-shaped slots 120, 122 formed in end caps 102, 104. Moreover, each latching subassembly 300 is rotated relative to door component 106 and end caps 102, 104 such that V-shaped latching regions 230 are outwardly directed so as to receive projections 410, 414. V-shaped latching regions 230 are positioned for receipt of projections 410, 414 when they are substantially aligned with V-shaped slots 120, 122, i.e., aligned with openings 158, 160 of guide channels 154, 156. Rotation of latching assemblies 300 relative to door component 106 and end caps 102, 104 is achieved by grasping handle portion 188 of the appropriate elongated latching member 180, 182 (at any point along its length which advantageously extends substantially the entire height of the disclosed door assembly), and rotating such handle portion away from the angled faces 142, 144 of door component 106. Thus, with reference to FIG. 1, the left handle portion 188 is rotated clockwise to align the V-shaped latching region for receipt of projections 410, 414, whereas the right handle portion 188 is rotated counter-clockwise to place the V-shaped latching region in alignment with V-shaped slot 120 for receipt of projections 410, 414.

As noted above, when latching assembly 300 is rotated relative to wall component 106, arcuate face 146, 148 travels within bounded space 198. Rotational travel of latching assembly 300 is limited by engagement of extension 197 with inner edge 155a, 155b of guide channels 154, 156, respectively. In an exemplary embodiment of the present disclosure, when extension 197 comes into abutting contact with inner edge 155a or 155b, the corresponding V-shaped latching regions 130 are aligned with V-shaped slots 120, 122 for receipt of projections 410, 414. Of note, the initial rotational movement of latching subassembly 300 relative to wall component 106 (i.e., from the position shown in FIG. 1) overcomes the resistance of deflection arms 224 (which deflect inward), such resistance providing a tactile sensation to the user of the disclosed door assembly.

Once V-shaped latching regions 230 are aligned with V-shaped slots 120, 122, the exemplary door 100 of the present disclosure may be advantageously mounted to cable management rack 400 by positioning projections 410, 414 within V-shaped latching regions. By rotating latching assemblies 300 to/toward the positions shown in FIG. 1 (by grasping the applicable handle portion 188 at any point along its length), V-shaped latching regions 230 capture projections 410, 414 within guide channels 154, 156. Thus, with handle portions 188 in the orientation shown in FIG. 1, latching assemblies 300 effectively capture the mounting members associated with cable management system 400. According to an exemplary embodiment of the present disclosure, door 100 cooperates with base member 406 such that protuberances 124, 126 on end caps 102, 104 interact with one or more circular indents 407 on base member 406, e.g., when in the closed position.

Figure 10A:
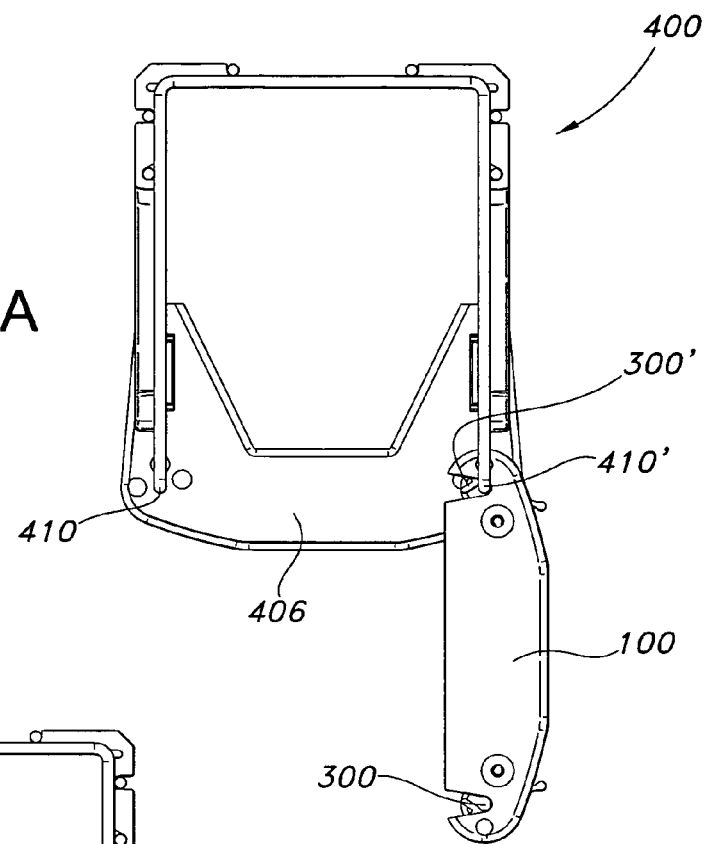
FIG. 10A is a top view of an exemplary door according to the present disclosure in an open position relative to a wire cage assembly/cable guide subassembly (as shown in FIG. 2 hereto)
Figure 10B:
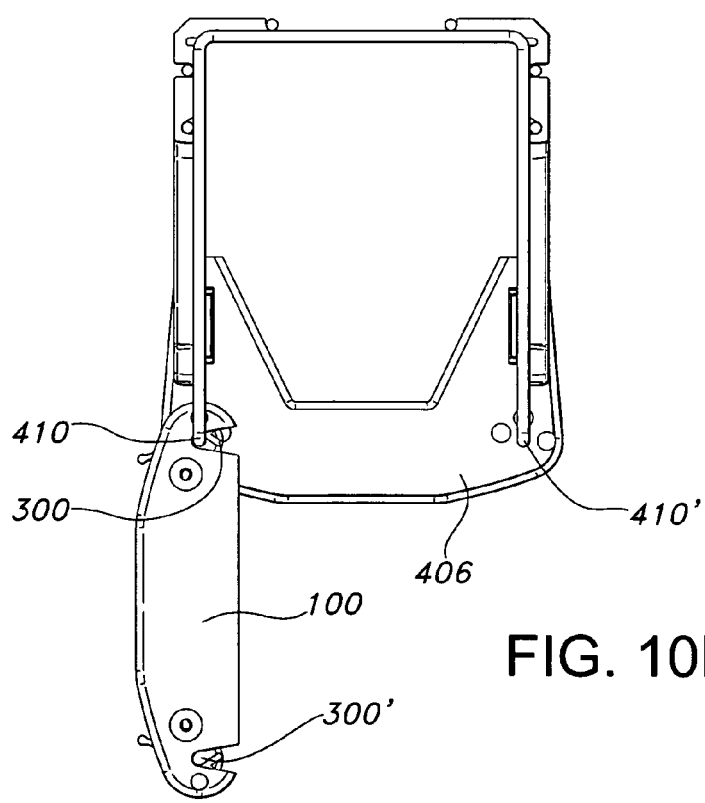
FIG. 10B is a further top view of the exemplary door according of FIG. 10A in a distinct open position relative to the wire cage assembly/cable guide subassembly.

With reference to FIGS. 10A and 10B, advantageous aspects of the disclosed door 100 are further disclosed. Thus, as shown in FIG. 10A, by releasing the left projection 410 (and left projection 414), door 100 is free to swing open from left-to-right, i.e., in a counter-clockwise direction. Of note and with further reference to FIG. 10A, projection 410' remains captured or locked within latching subassembly 300', while latching subassembly 300 is in the closed position, but without projections 410, 414 captured therewithin. By contrast, as shown in FIG. 10B, door 100 is also adapted to rotate from right-to-left, i.e., in a clockwise direction, by releasing right projection 410' (and right projection 414) from latching subassembly 300'. Moreover, the disclosed door assembly 100 facilitates complete removal from an associated mounting mechanism, e.g., cable management system 400, by releasing all projections 410, 414 from the associated latching subassemblies 300, 300'.

Figure 11:
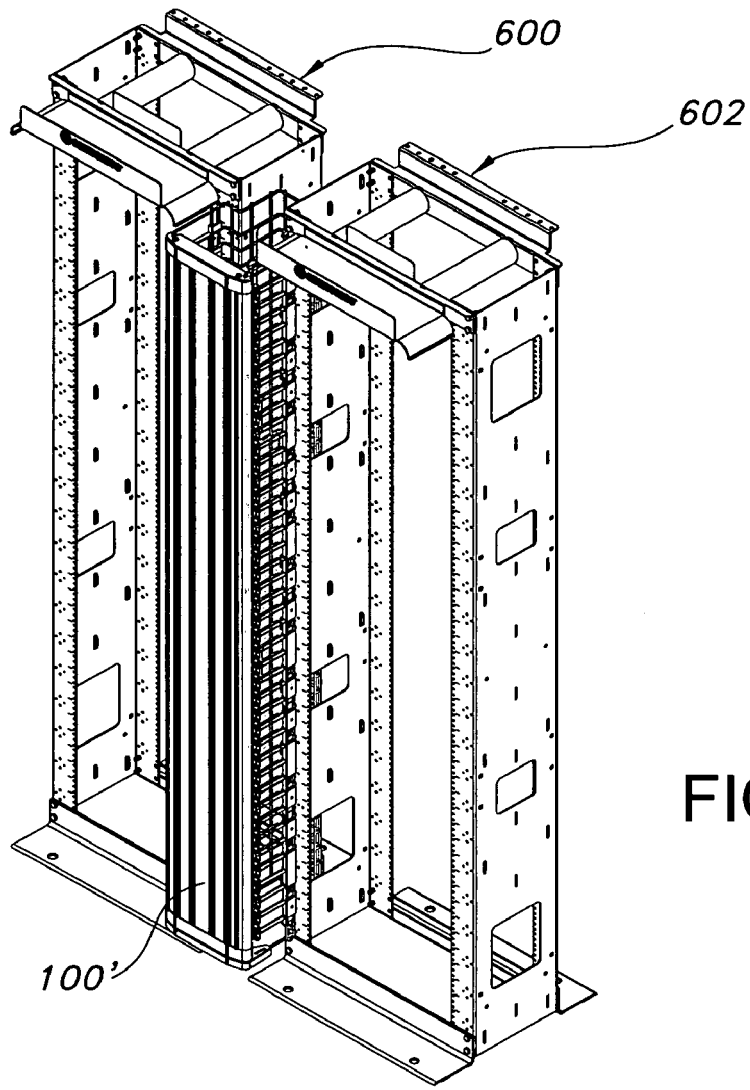
FIG. 11 is a perspective plan view of two racks with a wire cage assembly, a plurality of cable guides and an exemplary door according to the present disclosure mounted with respect thereto.
Figure 12:
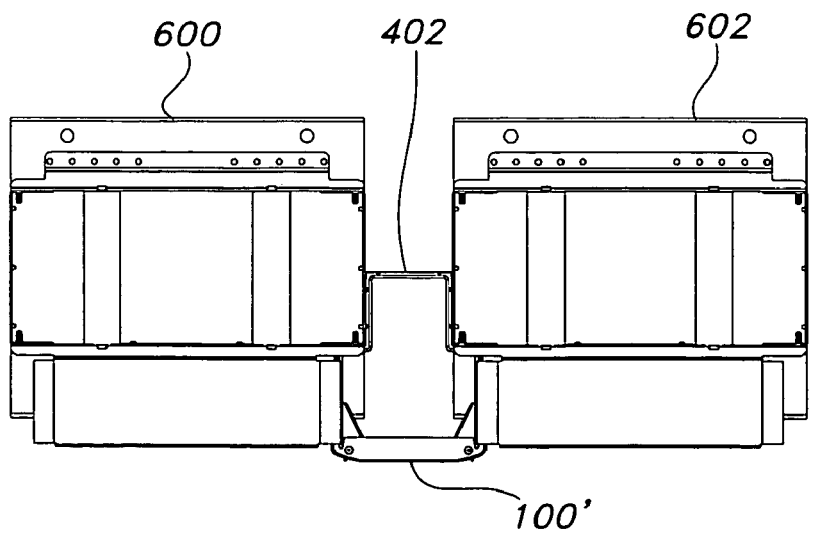
FIG. 12 is a top view of the overall assembly of FIG. 11.

With reference to FIGS. 11 and 12, the exemplary door assembly 100 and associated mounting structure, e.g., cable management system 400, may be advantageously mounted to conventional rack, frame and/or cabinet assemblies. Thus, as shown in FIGS. 11 and 12, wire cage assembly 402 is mounted to first rack 600 and second rack 602. Of note, the wire cage assembly depicted in FIGS. 11 and 12 differs from wire cage assembly 402 discussed above in that a U-shaped extension region is defined in the rear wall thereof. The U-shaped extension region is dimensioned and configured to fit between adjacent racks 600, 602 in the manner depicted in FIG. 11. First and second racks 600, 602 are of conventional design and are merely illustrative of the types of racks to which the wire cage assembly/cable guide(s) of the present disclosure may be mounted.

A plurality of cable guides are mounted to wire cage assembly. An elongated door member 100' according to the present disclosure is also mounted with respect to wire cage assembly in the manner discussed with reference to door member 100 above. Once mounted to racks 600, 602, the wire cage assembly/cable guides subassembly provides an advantageous cable management system for routing of cables/wires relative to equipment positioned on/in racks 600, 602, and door 100' provides ready access to such cables/wires, e.g., by permitting left-to-right or right-to-left opening of door 100', and complete removal of door 100' therefrom.

The present disclosure thus provides advantageous and easily-utilized mechanisms for mounting, opening, closing and releasing a door assembly relative to a mounting structure. The disclosed mechanisms advantageously employ a first structure that defines at least one elongated guide channel and a latching subassembly that is adapted to be mounted with respect to the foregoing guide channel(s) and to rotate with respect thereto. According to exemplary embodiments of the disclosed latching mechanisms, rotation of the latching assembly with respect to the guide channel(s) allows a latching region, e.g., a V-shaped latching region, to move between a first position (wherein the latching region is adapted to receive a mounting structure) and a second position (wherein the latching region cannot receive a mounting structure). In the second position, the latching region (in combination with the guide channel) is structured to capture a mounting structure (e.g., a projection associated with a cable management system) therewithin. Additional advantageous features and functionalities associated with the disclosed door assembly and latching subassembly, as well as their methods for use, are readily apparent from the detailed description provided herein.

Having thus described preferred and/or exemplary embodiments and uses/applications of the present disclosure, it is to be understood that the specifically disclosed embodiments/applications/uses are merely illustrative of the scope of the present disclosure. Various changes may be made in the function and arrangement of aspects hereof; equivalent means may be substituted for those described and/or illustrated; and certain features may be used inde-

What is claim is:

1. A method for mounting a door assembly relative to a mounting structure, comprising:
   (a) providing said mounting structure that includes at least two pairs of mounting extensions;
   (b) providing said door assembly that includes (i) a door component that defines first and second guide channels; (ii) a first end cap that is mountable with respect to a first end of said door component and that defines at least two slots in a back face thereof; (iii) a second end cap that is mountable with respect to a second end of said door component and that defines at least two slots in a back face thereof, and (iv) a pair of latching subassemblies that are rotatably mounted with respect to said first and second guide channels, respectively, each of said pair of latching subassemblies including an elongated latch member, a pair of latch elements mounted with respect to said elongated latch member, and an accessible handle portion; wherein each of said latch elements defines a slot that may be rotated between (i) a first position wherein at least one of said mounting extensions may be received by said slot, and (ii) a second position wherein said at least one of said mounting extensions may be captured by said slot and said first or second guide channel; and
   (c) pivotally mounting said door assembly to said mounting structure by capturing said at least two pairs of mounting extensions within said slots defined by said latch elements.

2. The method according to claim 1, wherein said mounting structure is a wire cage assembly.

3. The method according to claim 1, further comprising selectively releasing said mounting extensions at a first or second side of said door assembly so as to permit said door assembly to be swung open from said first or second side of said door assembly.

4. The method according to claim 1, wherein each said handle portion has a height that is substantially equal to a height of said door component.

5. The method according to claim 1, further comprising releasing all of said mounting extensions and removing said door assembly from said mounting structure.

6. The method according to claim 1, wherein said door component further defines at least one arcuate region for use in mounting at least one of said first end cap and said second end cap to said door component.

7. The method according to claim 1, wherein each of said first and second guide channels of said door component defines a stop, and wherein said stop of said first guide channel interacts with said respective latching subassembly to limit rotational motion of said respective latching subassembly relative to said first guide channel.

8. The method according to claim 1, wherein each of said first and second end caps includes outwardly directed arcuate faces at opposite sides thereof.

9. The method according to claim 1, wherein said at least two slots in the back face of each of said first end cap and said second end cap are V-shaped.

10. The method according to claim 1, wherein each of said elongated latch members includes an inner channel wall that defines a channel region.

11. The method according to claim 10, wherein: (i) a bounded space is defined between said inner channel wall and said handle portion of each of said latching subassemblies, (ii) said door component defines a first side that includes a first arcuate face and a second side that defines a second arcuate face, and (iii) each of said first and second arcuate faces of said door component travels within said bounded space of a respective one of said latching subassemblies as said respective latching subassembly is rotated relative to said door component.

12. The method according to claim 10, wherein each of said elongated latch members further includes a key extending into said channel region.

13. The method according to claim 12, wherein each of said latch elements includes a key slot that is adapted to cooperate with a respective one of said keys for alignment of said latch element relative to a respective one of said elongated latch members.

14. The method according to claim 1, wherein each of said latch elements includes: (i) a mounting extension, (ii) an intermediate band, and (iii) a latching region that includes said slot for receiving and capturing said at least one of said mounting extensions.

15. The method according to claim 14, wherein each said mounting extension includes an arcuate shell for cooperation with at least one opening formed in a respective one of said elongated latch members.

16. The method according to claim 14, wherein each said mounting extension is configured and dimensioned to be inserted into a channel defined within a respective one of said elongated latch members.

17. The method according to claim 14, wherein each said intermediate band defines a deflection arm that interacts with a respective one of said first or second guide channels.

* * * * *